US012803142B2

(12) United States Patent
Bi et al.

(10) Patent No.: US 12,803,142 B2
(45) Date of Patent: Nov. 17, 2026

(54) ABSORPTION TERAHERTZ DIRECT MODULATOR WITH ZERO REFLECTION

(71) Applicant: University of Electronic Science and Technology of China, Chengdu (CN)

(72) Inventors: Chunyang Bi, Chengdu (CN); Sen Gong, Chengdu (CN); Ziqiang Yang, Chengdu (CN); Yaxin Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 24 days.

(21) Appl. No.: 19/173,641

(22) Filed: Apr. 8, 2025

(65) Prior Publication Data

US 2026/0196704 A1 Jul. 9, 2026

(30) Foreign Application Priority Data

Jan. 9, 2025 (CN) ......................... 202510037429.6

(51) Int. Cl.
*H01P 1/201* (2006.01)
*G02F 1/025* (2006.01)
*H03C 7/02* (2006.01)

(52) U.S. Cl.
CPC ............ *H01P 1/2016* (2013.01); *G02F 1/025* (2013.01); *H03C 7/027* (2013.01); *G02F 2203/13* (2013.01)

(58) Field of Classification Search
CPC .... G02F 2203/13; G02F 1/0081; G02F 1/015; G02F 1/025; H04B 10/501; H04B 10/90; G01N 21/3581; H01P 1/20; H01P 7/082; H03C 7/025; H03C 7/02; H03C 7/00; H03C 7/027
See application file for complete search history.

(56) References Cited

U.S. PATENT DOCUMENTS

2020/0249503 A1* 8/2020 Zhang ...................... G02F 1/015
2020/0259235 A1* 8/2020 Zhang ..................... H03C 7/025

FOREIGN PATENT DOCUMENTS

CN 117525779 A * 2/2024 ................ H01P 1/20

OTHER PUBLICATIONS

Ding, Kesen, et al. "A high power capacity terahertz on-chip modulator based on SRR." 2024 49th International Conference on Infrared, Millimeter, and Terahertz Waves (IRMMW-THz). IEEE, 2024. (Year: 2024).*

* cited by examiner

*Primary Examiner* — Ryan Johnson
(74) *Attorney, Agent, or Firm* — The Sun IP Law

(57) ABSTRACT

Disclosed is an absorption terahertz direct modulator with zero reflection. The absorption terahertz direct modulator with zero reflection includes a rectangular waveguide and a modulation module, two ends of the rectangular waveguide are waveguide ports, the modulation module penetrates through cavity wall of the rectangular waveguide and is placed on a wide side of the rectangular waveguide in a way that its face is perpendicular to a face of the waveguide port, the modulation module includes filter units and a modulation unit disposed between the filter units, a cross-shaped slot line transmission structure and a semiconductor regulation device disposed on the cross-shaped slot line transmission structure are disposed on a front side of the modulation unit, a dual split ring is disposed on back of the modulation unit, and the dual split ring corresponds to the cross-shaped slot line in position.

10 Claims, 5 Drawing Sheets

ABSORPTION TERAHERTZ DIRECT MODULATOR WITH ZERO REFLECTION

TECHNICAL FIELD

The present disclosure relates to the technical field of terahertz communication, in particular to an absorption terahertz direct modulator with zero reflection.

BACKGROUND

Terahertz wave is an electromagnetic wave frequency band with a frequency spectrum of 0.1-10 THz. Terahertz communication technology, as an important alternative technology for a 6G-oriented next-generation mobile communication technology, can meet the requirement of ultra-high transmission rate in terabit range, and has a very broad application scene.

A terahertz direct modulator, as a core device of a terahertz direct communication system, realizes information loading of terahertz carrier wave through high-speed switching between an on state and an off state. At present, a terahertz direct modulator is mainly realized based on strong and weak resonance conversion and circuit topological structure principle, and these methods cannot realize terahertz regulation without reflection, with low insertion loss and high isolation at the same time in terms of mechanism [1]-[3].

[1] Zhang T, Zhang Y. On-chip thz dynamic manipulation based on tunable spoof surface plasmon polaritons[J]. IEEE Electron Device Letters, 2019, 40(11):1844-1847.

[2] Zhang Y X, Ding K S, Zeng H X, et al. Ultrafast modulation of terahertz waves using on-chip dual-layer near-field coupling[J]. Optica, 2022, 9(11): 1268-1275.

[3] C. Bi, S. Gong, K. Ding, H. Liang, Z. Yang and Y. Zhang, "A terahertz absorption modulator based on GaAs Schottky Diodes," 2024 49th International Conference on Infrared, Millimeter, and Terahertz Waves (IRMMW-THz), Perth, Australia, 2024, pp. 1-2,

SUMMARY

The present disclosure provides an absorption terahertz direct modulator with zero reflection.

An absorption terahertz direct modulator with zero reflection includes a rectangular waveguide and a modulation module, two ends of the rectangular waveguide are waveguide ports, the modulation module penetrates through cavity wall of the rectangular waveguide and is placed on a wide side of the rectangular waveguide in a way that a face of the modulation module is perpendicular to a face of the waveguide port, the modulation module includes filter units and a modulation unit disposed between the filter units, a cross-shaped slot line transmission structure and a semiconductor regulation device disposed on the cross-shaped slot line transmission structure are disposed on a front side of the modulation unit, a dual split ring is disposed on back of the modulation unit, a cross-shaped slot line is disposed on the cross-shaped slot line transmission structure, and the dual split ring corresponds to the cross-shaped slot line in position.

The dual split ring is composed of two split rings with opposite opening directions.

The absorption terahertz direct modulator with zero reflection includes two dual split rings, and the two dual split rings are disposed in a mirror image with a vertical part of the cross-shaped slot line as an axis.

The vertical part of the cross-shaped slot line is parallel to a direction in which the modulation module penetrates through the rectangular waveguide.

Furthermore, the absorption terahertz direct modulator with zero reflection only includes one dual split ring, which corresponds to a middle part of the cross-shaped slot line in the cross-shaped slot line transmission structure in position.

Furthermore, the modulation module is composed of a substrate and metal circuit structures disposed on two sides of the substrate, the filter units and the cross-shaped slot line transmission structure are disposed on one side of the substrate, the semiconductor regulation device is fixed on the cross-shaped slot line transmission structure, and the dual split ring is disposed on the other side of the substrate.

Furthermore, material of the substrate is any one of GaAs, SiC and GaN.

Furthermore, when the rectangular waveguide is a WR-2.8 standard rectangular waveguide, the modulation module is in a middle of the wide side of the rectangular waveguide.

Furthermore, the modulation unit is inside the rectangular waveguide, and the filter unit is outside the rectangular waveguide.

Furthermore, the filter unit is an I-shaped low-pass filter, and is a microstrip low-pass filter circuit.

Two I-shaped filters are placed symmetrically left and right with the rectangular waveguide as an axis; and an additional modulation signal is input from the I-shaped low-pass filter on one side, and is connected to a matched load through the I-shaped low-pass filter on the other side after fed into the modulation unit.

Furthermore, working frequency of the modulator is shifted by adjusting a slot width and length of the cross-shaped slot line transmission structure.

Furthermore, the cross-shaped slot line transmission structure is composed of transmission lines disposed symmetrically, an interval between the transmission lines forms a horizontal part of the cross-shaped slot line, an opposite notch is disposed on an opposite side of each transmission line, the notches of the two transmission lines form a vertical part of the cross-shaped slot line, and the horizontal part is parallel to the rectangular waveguide.

Furthermore, the semiconductor regulation device is a plurality of terahertz Schottky diodes, a cathode and an anode of the terahertz Schottky diode are respectively placed on the transmission lines on two sides of the horizontal part of the cross-shaped slot line transmission structure, a total number of the plurality of terahertz Schottky diodes is M, M≥2, the anodes of the terahertz Schottky diodes is on a same side, and the cathodes of the plurality of terahertz Schottky diodes are on a same side, forming a parallel connection mode.

Furthermore, a split ring of the dual split ring is any one of a round split ring and a square split ring.

Furthermore, material of the substrate is any one of quartz, sapphire, silicon dioxide, gallium arsenide and silicon carbide.

DESCRIPTION OF REFERENCE NUMERALS

Figure 1:
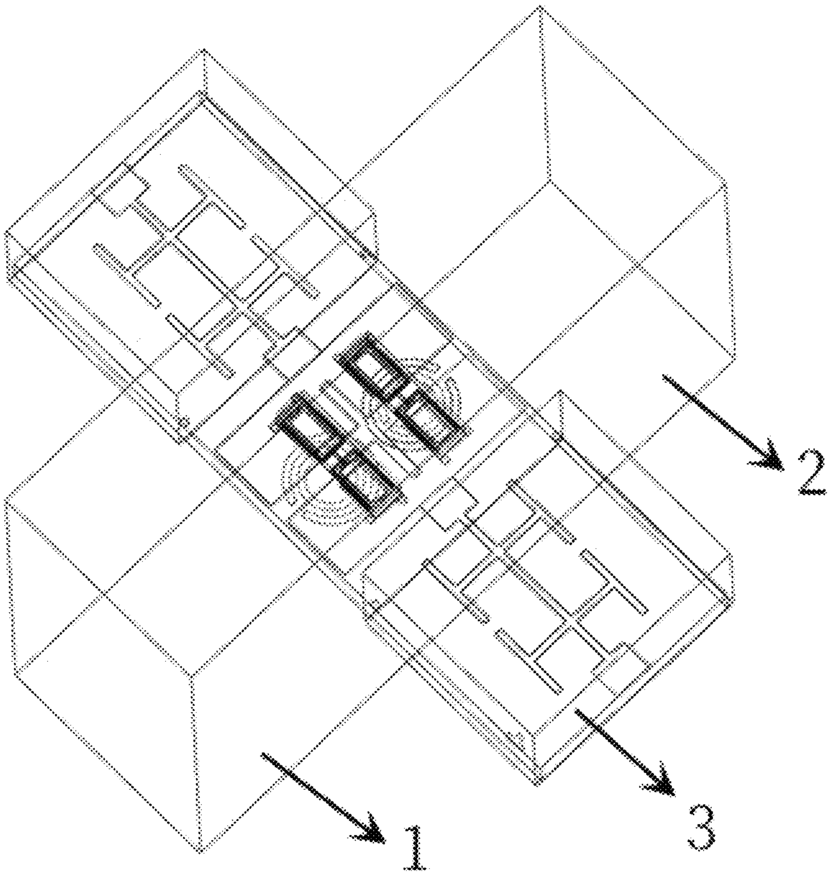
FIG. 1 is a structure schematic diagram of an absorption terahertz direct modulator with zero reflection provided by an embodiment of the present disclosure.

1. Input waveguide; 2. Output waveguide; 3. Modulation module; 31. First filter unit; 32. Cross-shaped slot line transmission structure; 33. Semiconductor regulation device; 34. Second filter unit; and 35. Dual split ring.

DETAILED DESCRIPTION OF THE EMBODIMENTS

In order to make the purpose, the technical solutions and the advantages of the embodiments of the present disclosure clearer, the technical solutions in the embodiments of the present disclosure will be clearly and completely described below in combination with the drawings in the embodiments of the present disclosure, and it is apparent that the described embodiments are only a part rather all of embodiments of the present disclosure. Therefore, the following detailed descriptions of the embodiments of the present disclosure provided in the drawings are not intended to limit the scope of the claimed present disclosure, but only represent selected embodiments of the present disclosure. All other embodiments obtained by the skilled in the art based on the embodiments in the present disclosure without creative work shall fall within the scope of protection of the present disclosure.

The present disclosure provides an absorption terahertz direct modulator with zero reflection, which solves the problem that an existing solution of a direct modulator is difficult to integrate with a front-end radio frequency device.

The present disclosure provides an absorption terahertz direct modulator with zero reflection, which realizes regulation on terahertz wave based on a double-layer artificial microstructure. The design method is simple and effective, and may realize terahertz regulation without reflection, with low insertion loss and high isolation. A new design concept is provided for a next-generation 100 Gbps terahertz communication system, and the problem that an existing solution of a direct modulator is difficult to integrate with a front-end radio frequency device will be effectively solved.

Figure 2:
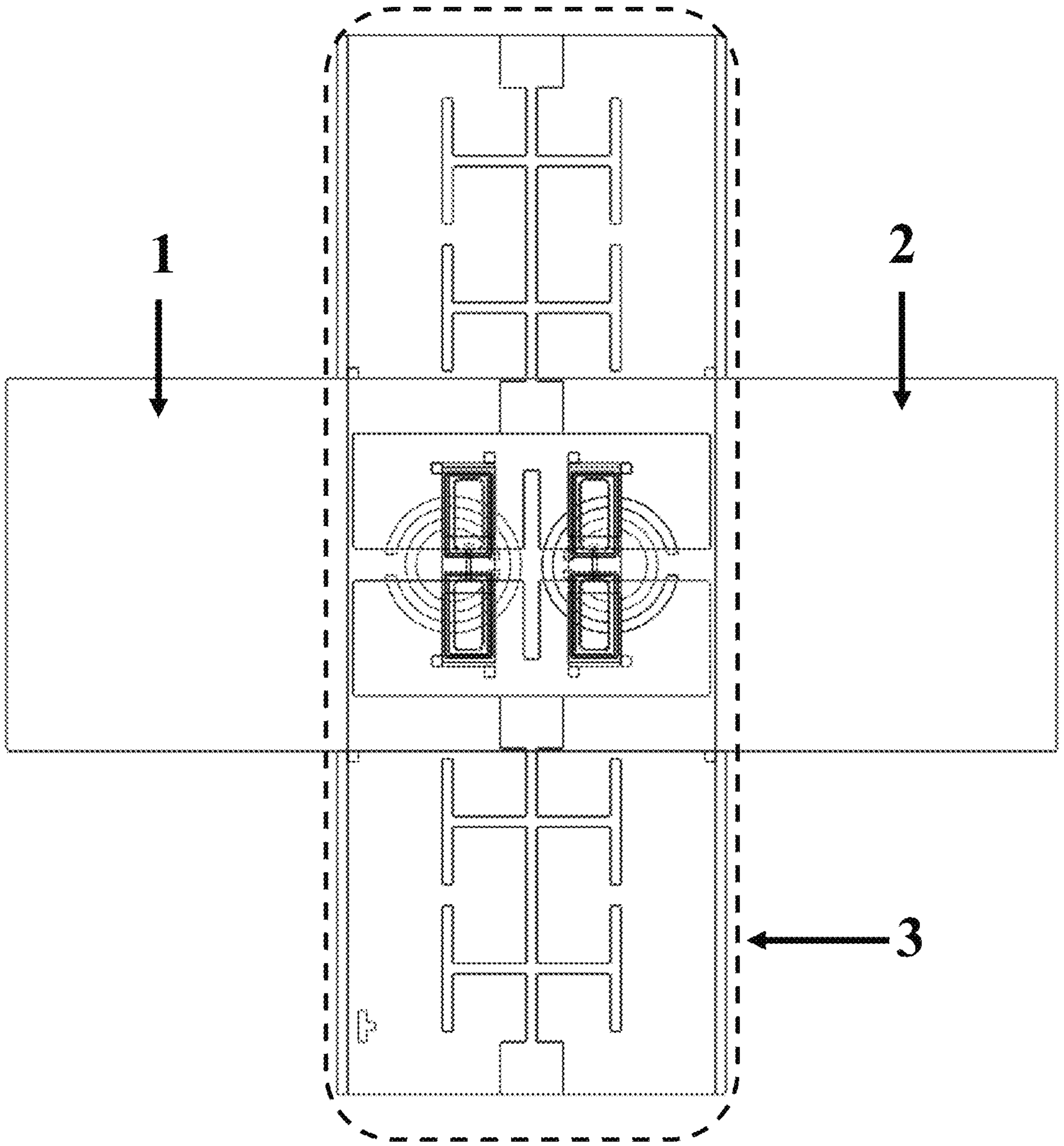
FIG. 2 is a schematic diagram in a top view of an absorption terahertz direct modulator with zero reflection provided by an embodiment of the present disclosure.

An absorption terahertz direct modulator with zero reflection, as shown in FIGS. 1-2, includes a rectangular waveguide and a modulation module 3, two ends of the rectangular waveguide are waveguide ports, the modulation module 3 penetrates through cavity wall of the rectangular waveguide and is placed on a wide side of the rectangular waveguide in a way that its face (the top face of the modulation module 3) is perpendicular to a face of the waveguide port, the modulation module 3 includes filter units and a modulation unit disposed between the filter units, a cross-shaped slot line transmission structure 32 and a semiconductor regulation device 33 disposed on the cross-shaped slot line transmission structure 32 are disposed on a front side of the modulation unit, a dual split ring 35 is disposed on the back of the modulation unit, and the dual split ring 35 corresponds to a cross-shaped slot line of the cross-shaped slot line transmission structure 32 in position.

The dual split ring 35 is composed of two split rings with opposite opening directions, and the split rings are round split rings.

Two dual split rings 35 are available, and the two dual split rings 35 are disposed in a mirror image with a vertical part of the cross-shaped slot line as an axis.

An extension direction of the vertical part of the cross-shaped slot line is parallel to a direction in which the modulation module 3 penetrates through the rectangular waveguide.

The rectangular waveguide adopts a WR-2.8 standard rectangular waveguide, the rectangular waveguide at one end of the modulation module 3 is an input waveguide 1 configured for inputting terahertz wave, and the rectangular waveguide at the other end of the modulation module 3 is an output waveguide 2 configured for outputting a modulated terahertz envelope signal.

In another embodiment, only one dual split ring 35 is available, which corresponds to a middle part of the cross-shaped slot line transmission structure 32 in position, and is suitable for terahertz modulation above 500 GHz.

Figure 3:
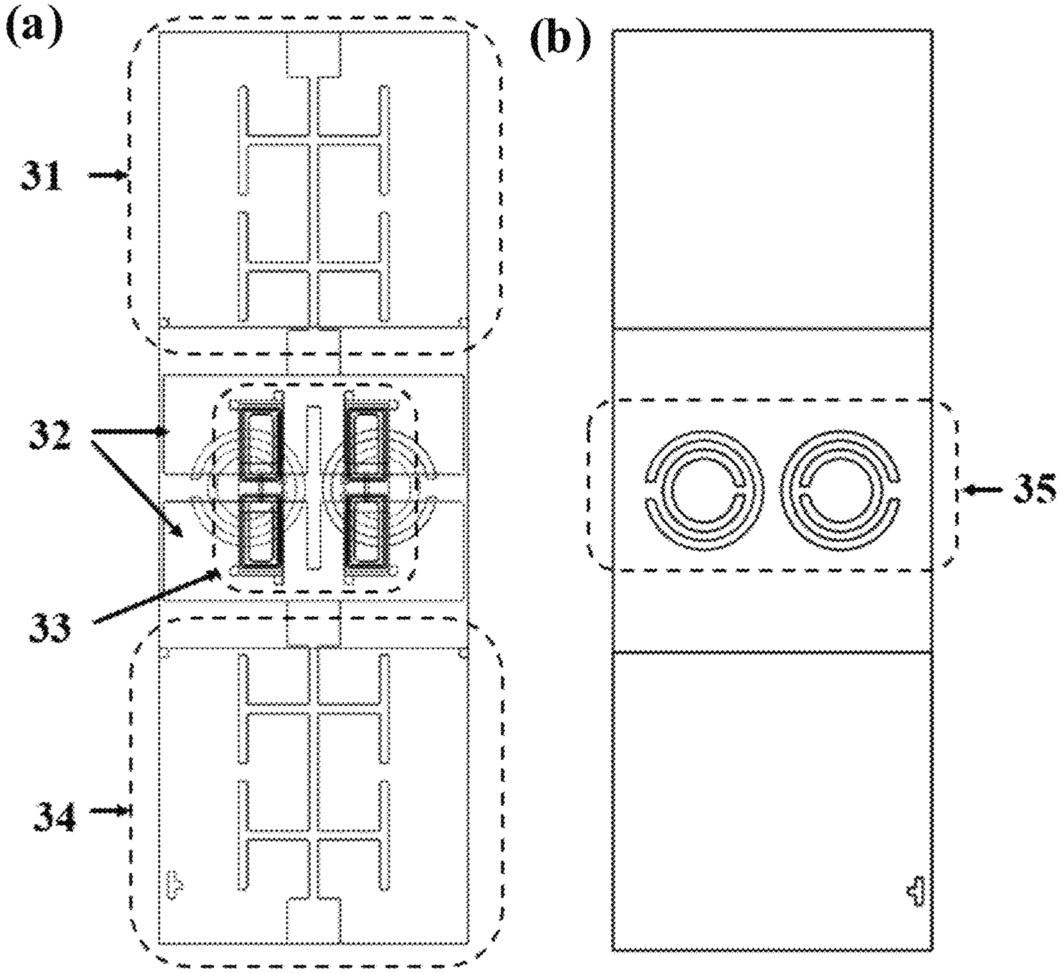
FIG. 3 is a structure schematic diagram of a modulation module provided by an embodiment of the present disclosure.

In another embodiment, as shown in FIG. 3, the modulation module 3 is composed of a substrate and metal circuit structures disposed on two sides of the substrate, two filter units and the cross-shaped slot line transmission structure 32 of the modulation unit are disposed on one side of the substrate, namely, the side shown in FIG. 3 (*a*), the two filter units are respectively a fist filter unit 31 and a second filter unit 34, the semiconductor regulation device 33 is fixed on the cross-shaped slot line transmission structure 32, the dual split ring 35 of the modulation unit is disposed on the other side of the substrate, namely the side shown in FIG. 3 (*b*), and the material of the substrate adopts quartz.

The filter unit is an I-shaped low-pass filter, and is a microstrip low-pass filter circuit, which is configured for restraining the terahertz wave and feeding in a high-speed modulation signal.

Two I-shaped filters are placed symmetrically left and right with the rectangular waveguide as an axis; and an additional modulation signal is input from the I-shaped low-pass filter on one side, and is connected to a matched load through the I-shaped low-pass filter on the other side after fed into the modulation unit.

In another embodiment, the material of the substrate may be any one of GaAs, SiC and GaN.

In another embodiment, when the rectangular waveguide adopts a WR-2.8 standard rectangular waveguide, the modulation module 3 is in the middle of the wide side of the rectangular waveguide.

The modulation unit is inside the rectangular waveguide, and the filter unit is outside the rectangular waveguide.

In another embodiment, the working frequency of the modulator may be shifted by adjusting the slot width and length of the cross-shaped slot line transmission structure 32.

In another embodiment, the cross-shaped slot line transmission structure 32 is composed of transmission lines disposed symmetrically, an interval between the transmission lines forms a horizontal part of the cross-shaped slot line, an opposite notch is disposed on an opposite side of the transmission line, the notches of the two transmission lines form a vertical part of the cross-shaped slot line, and an extension direction of the horizontal part is parallel to a propagation direction of the rectangular waveguide.

In another embodiment, the material of the transmission line is metal, and metal involved in the whole modulator may use Ag, Cu, Al and the like.

In another embodiment, the semiconductor regulation device 33 is a plurality of terahertz Schottky diodes, a cathode and an anode of the terahertz Schottky diode are respectively placed on the transmission lines on two sides of the horizontal part of the cross-shaped slot line transmission structure 32, a total number of the plurality of terahertz Schottky diodes is M, M≥2, the anodes of the terahertz Schottky diodes are on the same side, and the cathodes are on the same side, forming a parallel connection mode. By adjusting the number of the terahertz Schottky diode and the distance between each two, the amplitude and working frequency may be well adjusted to meet design requirements.

In another embodiment, the semiconductor regulation device 33 may be any one of a PIN diode and a field-effect transistor.

In another embodiment, the split ring of the dual split ring 35 is a square split ring.

In another embodiment, the material of the substrate is any one of quartz, sapphire, silicon dioxide, gallium arsenide and silicon carbide.

The implementation mode of the present disclosure is based on the principle that the dual split ring 35 realizes field absorption, and realizes the regulation function of terahertz wave combining with the modulation module 3 composed of the semiconductor regulation device 33, the cross-shaped slot line transmission structure 32 and the filter unit. Terahertz wave with main mode TE10 is fed by the standard WR2.8 waveguide, the modulation module 3 regulates the TE10 wave, when the modulation module 3 is in an on state, the modulator is in an on state, the terahertz wave can be transmitted, and when the modulation module 3 is in an off state, the terahertz wave cannot be transmitted. Based on this, the regulation function on the terahertz wave is realized, it is important that when the modulator is disconnected, the terahertz wave is bound in the dual split ring 35 on the back through the joint action of the cross-shaped slot line and the semiconductor regulation device 33 to realize cancellation. Therefore, the present disclosure realizes terahertz absorption regulation without reflection under small loss and large modulation depth.

Figure 4:
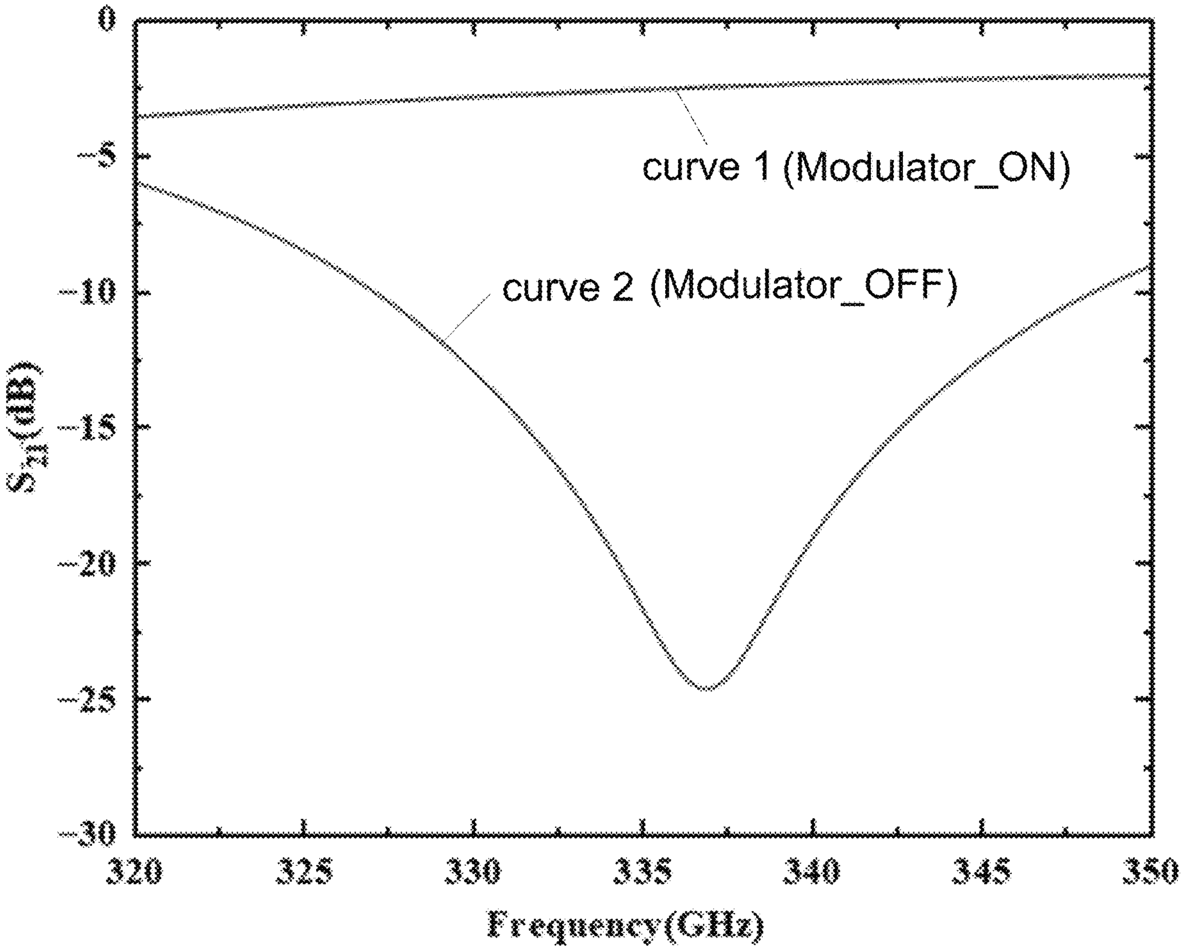
FIG. 4 is a result of transmission coefficient $S_{21}$ under on/off state of a modulator provided by an embodiment of the present disclosure.
Figure 5:
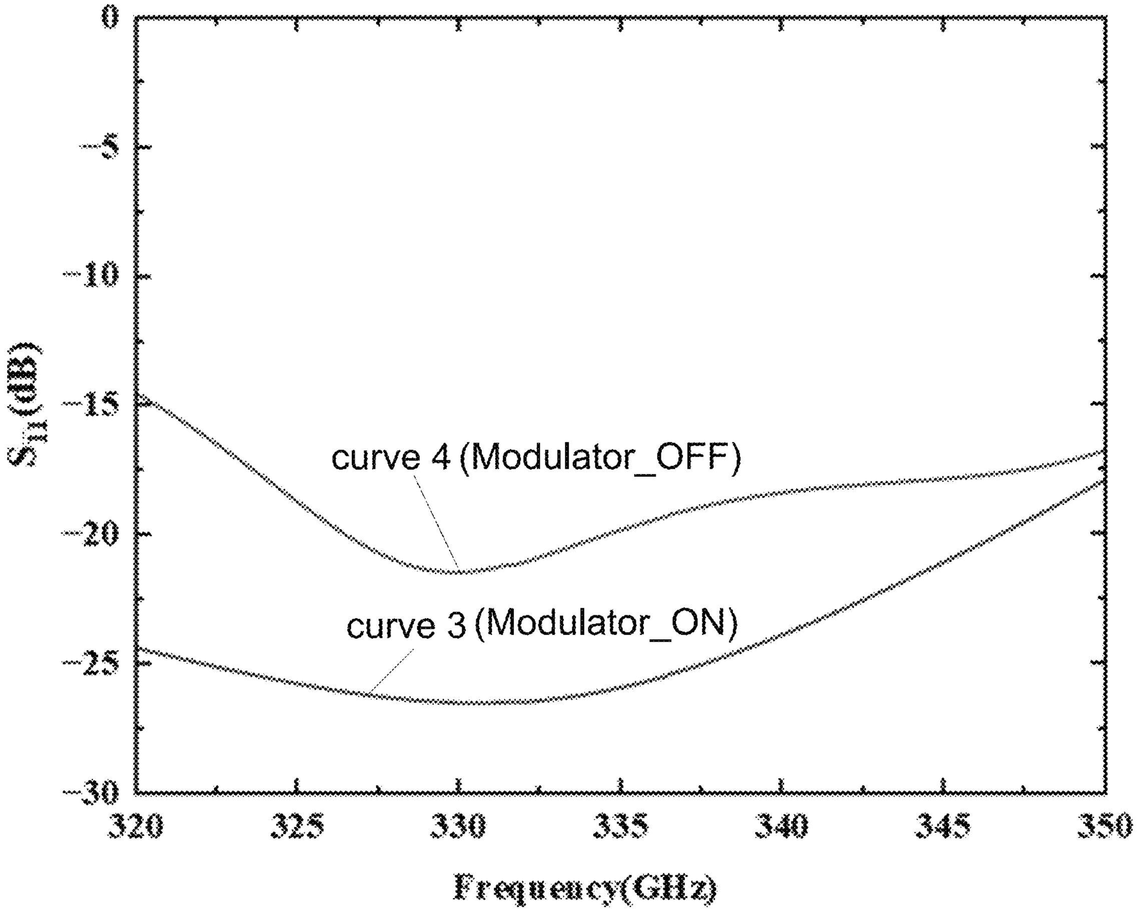
FIG. 5 is a result of return loss $S_{11}$ under on/off state of a modulator provided by an embodiment of the present disclosure.

The simulation experiment result is as shown in FIGS. 4-5, the details are as follows.

In FIG. 4, the curve 1 is an insertion loss curve when the modulator is in an on state, and the curve 2 is an isolation curve when the modulator is disconnected. For the embodiment, the optimal working point is near 336 GHz, with a minimum insertion loss of 2.4 db and an isolation of 24.5 db. The regulation effect with good performance is realized above 300 GHz due to the modulation module 3, the cross-shaped slot on the front and the dual complementary lantern rings on the back form a strong resonance absorption structure, and it is realized under regulation of the terahertz Schottky diodes.

In FIG. 5, the curve 3 is a return loss curve when the modulator is in an on state, and the curve 4 is a return loss curve when the modulator is disconnected. For the embodiment, when the modulator is connected or disconnected, a bandwidth with return loss less than 15 db is 30 GHZ at the same time, and the result shows the excellent property of the modulation module 3. Benefit from this, very low return loss may still be realized under the condition that the modulator has the maximum isolation of 24.5 db.

The present disclosure has the following beneficial effects.

(1) The present disclosure realizes regulation on the semiconductor regulation device through change of voltage, a resonance state is formed on the cross-shaped slot line, an absorption structure is formed through the dual split ring on the back, and non-reflection absorption modulation (low return loss) is realized while large modulation depth is realized.

(2) The present disclosure has very strong frequency shift property, and the working frequency of the modulator may be effectively adjusted by adjusting the interval, position, size and the like of each semiconductor regulation device.

(3) By the method of the dual split ring, the present disclosure enhances the binding effect of the field when the modulator is disconnected to realize non-reflection absorption modulation.

(4) The present disclosure provides a concept for realizing high-precision terahertz modulation, and is convenient in realizing integration with an existing front-end radio frequency device, and meanwhile, the present disclosure has high shift property of working frequency, can work under normal temperature, normal pressure and non-vacuum conditions, is easy to package and convenient to use, and has a very wide application scene.

The embodiments described above represent only specific implementation modes of the present disclosure, and the description thereof is specific and detailed, but should not be construed as limiting the scope of protection of the present disclosure accordingly. It should be pointed out that those of ordinary skill in the art can also make several changes and improvements without departing from the concept of the technical solution of the present disclosure, and these changes and improvements all fall within the scope of protection of the present disclosure.

What is claimed is:

1. An absorption terahertz direct modulator with zero reflection, comprising a rectangular waveguide and a modulation module, wherein two ends of the rectangular waveguide are waveguide ports, the modulation module penetrates through cavity wall of the rectangular waveguide and is placed on a wide side of the rectangular waveguide in a way that a face of the modulation module is perpendicular to a face of the waveguide port, the wide side of the rectangular waveguide is a side with a largest width of the rectangular waveguide, the modulation module comprises filter units and a modulation unit disposed between the filter units, a cross-shaped slot line transmission structure and a semiconductor regulation device disposed on the cross-shaped slot line transmission structure are disposed on a front side of the modulation unit, a dual split ring is disposed on back of the modulation unit, a cross-shaped slot line is disposed on the cross-shaped slot line transmission structure, and the dual split ring corresponds to the cross-shaped slot line in position.

2. The absorption terahertz direct modulator with zero reflection according to claim 1, wherein the dual split ring is composed of two split rings with opposite opening directions.

3. The absorption terahertz direct modulator with zero reflection according to claim 1, wherein the absorption terahertz direct modulator with zero reflection comprises two dual split rings, the two dual split rings are disposed in a mirror image with a vertical part of the cross-shaped slot line as an axis, and an extension direction of the vertical part of the cross-shaped slot line is parallel to a direction in which the modulation module penetrates through the rectangular waveguide.

4. The absorption terahertz direct modulator with zero reflection according to claim 1, wherein the absorption terahertz direct modulator with zero reflection only comprises one dual split ring, which corresponds to a middle part of the cross-shaped slot line transmission structure in position.

5. The absorption terahertz direct modulator with zero reflection according to claim 1, wherein the modulation module is composed of a substrate and metal circuit structures disposed on two sides of the substrate, the metal circuit structure on one side of the substrate comprises the filter units and the cross-shaped slot line transmission structure, the semiconductor regulation device is fixed on the cross-shaped slot line transmission structure, and the metal circuit structure on the other side of the substrate is the dual split ring.

6. The absorption terahertz direct modulator with zero reflection according to claim 5, wherein material of the substrate is any one of GaAs, SiC and GaN.

7. The absorption terahertz direct modulator with zero reflection according to claim 5, wherein when the rectangular waveguide is a WR-2.8 standard rectangular waveguide, the modulation module is in a middle of the wide side of the rectangular waveguide, the modulation unit is inside the rectangular waveguide, and the filter unit is outside the rectangular waveguide.

8. The absorption terahertz direct modulator with zero reflection according to claim 1, wherein the cross-shaped slot line transmission structure is composed of transmission lines disposed symmetrically, an interval between the transmission lines forms a horizontal part of the cross-shaped slot line, a notch is disposed on a side of each transmission line near the other transmission line, the notches position correspond, the notches of the two transmission lines form a vertical part of the cross-shaped slot line, and an extension direction of the horizontal part is parallel to a propagation direction of the rectangular waveguide.

9. The absorption terahertz direct modulator with zero reflection according to claim 1, wherein the semiconductor regulation device is a plurality of terahertz Schottky diodes, a cathode and an anode of the terahertz Schottky diode are respectively placed on two sides of the cross-shaped slot line transmission structure, a total number of the plurality of terahertz Schottky diodes is M, M≥2, anodes of the plurality of terahertz Schottky diodes are on a same side, and cathodes of the plurality of terahertz Schottky diodes are on a same side, which are connected in parallel.

10. The absorption terahertz direct modulator with zero reflection according to claim 1, wherein the working frequency of the absorption terahertz direct modulator with zero reflection is shifted by adjusting a slot width and length of the cross-shaped slot line transmission structure.

* * * * *